US009773811B2

(12) United States Patent
Lorenz et al.

(10) Patent No.: US 9,773,811 B2
(45) Date of Patent: Sep. 26, 2017

(54) REDUCING ANTENNA EFFECTS IN SOI DEVICES

(71) Applicant: GLOBALFOUNDRIES Inc., Grand Cayman (KY)

(72) Inventors: Ingolf Lorenz, Dresden (DE); Stefan Block, Munich (DE); Ulrich Hensel, Dresden (DE); Jürgen Faul, Dresden (DE); Michael Zier, Dresden (DE); Haritez Narisetty, Santa Clara, CA (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/049,572

(22) Filed: Feb. 22, 2016

(65) Prior Publication Data

US 2017/0243894 A1    Aug. 24, 2017

(51) Int. Cl.
| H01L 27/12 | (2006.01) |
| H01L 23/62 | (2006.01) |
| H01L 21/00 | (2006.01) |
| H01L 21/84 | (2006.01) |
| H01L 21/8234 | (2006.01) |
| H01L 27/02 | (2006.01) |
| H01L 29/66 | (2006.01) |

(52) U.S. Cl.
CPC ...... *H01L 27/1207* (2013.01); *H01L 27/0255* (2013.01); *H01L 27/1203* (2013.01); *H01L 29/66121* (2013.01); *H01L 29/66568* (2013.01)

(58) Field of Classification Search
CPC ............. H01L 27/1207; H01L 27/1203; H01L 27/0255; H01L 29/66121

USPC ................ 257/347, 348, 350, 355, E27.113, 257/E27.112; 438/152, 155, 237
See application file for complete search history.

(56) References Cited

U.S. PATENT DOCUMENTS

| 6,566,713 B2 * | 5/2003 | Nii ........................ H01L 21/743 257/347 |
| 6,642,088 B1 * | 11/2003 | Yu ...................... H01L 21/76264 257/E21.564 |
| 2006/0226485 A1 * | 10/2006 | Arakawa ............. H01L 27/1203 257/347 |

OTHER PUBLICATIONS

2004 IEEE International Conference on Integrated Circuit Design and Technology; SOI Charging Prevention: Chip Level Net Tracing and Diode Protection; Terence B. Hook, Henry Bonges, David Harmon, Wing Lai.

* cited by examiner

*Primary Examiner* — Fernando L Toledo
*Assistant Examiner* — Aaron Gray
(74) *Attorney, Agent, or Firm* — Amerson Law Firm, PLLC (57) ABSTRACT

It is provided a semiconductor device comprising a power line, a Silicon-on-Insulator, SOI, substrate comprising a semiconductor layer and a semiconductor bulk substrate comprising a first doped region, a first transistor device formed in and above the SOI substrate and comprising a first gate dielectric formed over the semiconductor layer and a first gate electrode formed over the gate dielectric, a first diode electrically connected to the first gate electrode and a second diode electrically connected to the first diode and the power line; and wherein the first and second diodes are partially formed in the first doped region.

20 Claims, 4 Drawing Sheets

REDUCING ANTENNA EFFECTS IN SOI DEVICES

BACKGROUND OF THE INVENTION

1. Field of the Invention

Generally, the present disclosure relates to the field of integrated circuits and semiconductor devices and, particularly, the reduction of the antenna effect in an SOI device.

2. Description of the Related Art

The fabrication of advanced integrated circuits, such as CPUs, storage devices, ASICs (application specific integrated circuits), and the like, requires the formation of a large number of circuit elements on a given chip area according to a specified circuit layout. In a wide variety of electronic circuits field effect transistors represent one important type of circuit elements that substantially determine performance of the integrated circuits. Generally, a plurality of process technologies are currently practiced for forming field effect transistors (FETs), wherein for many types of complex circuitry metal-oxide-semiconductor (MOS) technology is currently one of the most promising approaches due to the superior characteristics in view of operating speed and/or power consumption and/or cost efficiency. During the fabrication of complex integrated circuits using, for instance, complementary MOS (CMOS) technology, millions of n-channel transistors and p-channel transistors are formed on a substrate including a crystalline semiconductor layer.

A field effect transistor, irrespective of whether an n-channel transistor or a p-channel transistor is considered, typically comprises so-called pn-junctions that are formed by an interface of highly doped regions, referred to as drain and source regions, with a slightly doped or non-doped region, such as a channel region, disposed between the highly doped regions. In a field effect transistor the conductivity of the channel region, i.e., the drive current capability of the conductive channel, is controlled by a gate electrode formed adjacent to the channel region and separated therefrom by a thin insulating layer. The conductivity of the channel region upon formation of a conductive channel due to the application of an appropriate control voltage to the gate electrode, depends on the dopant concentration, the mobility of the charge carriers, and—for a given extension of the channel region in the transistor width direction—on the distance between the source and drain regions, which is also referred to as channel length. Hence, in combination with the capability of rapidly creating a conductive channel below the insulating layer upon application of the control voltage to the gate electrode, the conductivity of the channel region substantially affects the performance of MOS transistors. Thus, as the speed of creating the channel, which depends on the conductivity of the gate electrode, and the channel resistivity substantially determine the transistor characteristics, the scaling of the channel length is a dominant design criterion for accomplishing an increase in the operating speed of the integrated circuits. As the channel length is reduced the thickness of the gate dielectric is also reduced. The scaling of the gate dielectric is limited by several factors such as defects, power supply voltage, time-dependent dielectric breakdown and leakage currents.

However plasma induced damages of gate dielectrics, called antenna effects, occurring during the overall processing of the semiconductor devices pose severe problems and may significantly affect yield and reliability of the semiconductor devices. The damages comprise plasma charging damages that particularly occur when electrical charges are collected from the plasma by the gate electrode and flow through the gate dielectric. For example, the antenna effect is caused by polysilicon, metal or contact etching and ion implantation.

Figure 1:
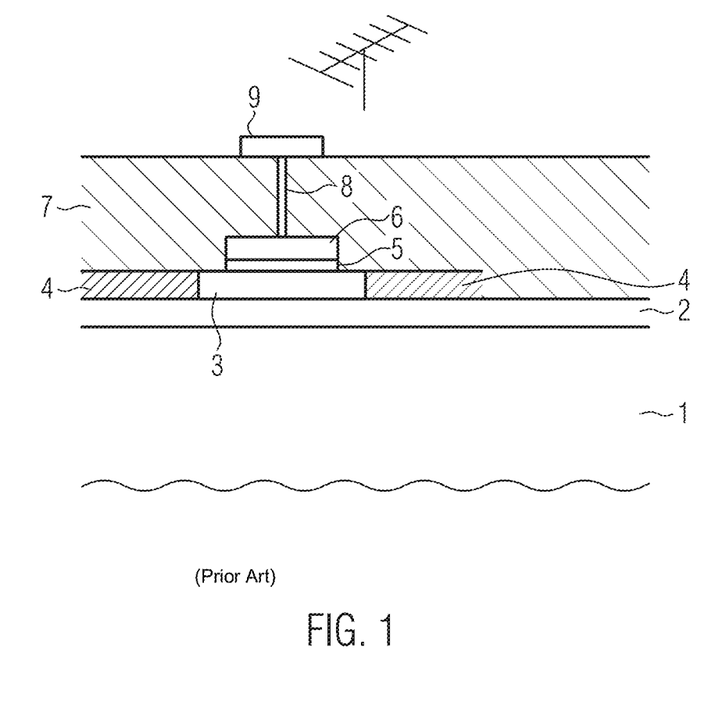
FIG. 1 illustrates an example of the antenna effect occurring during the processing of a semiconductor device.

An example of the antenna effect is illustrated in FIG. 1 FIG. 1 shows an SOI configuration comprising a semiconductor bulk substrate 1, a buried insulating layer 2 formed on the semiconductor bulk substrate 1 and a lightly doped or un-doped semiconductor region called channel 3 surrounded by heavily doped source and drain regions 4. A gate dielectric 5 is formed on the channel 3 and a gate electrode layer 6 of an FET device is formed on the gate dielectric 5. An interlayer dielectric 7 is formed over the structure of the FET and a contact 8 is formed in the interlayer dielectric 7 to electrically contact the gate electrode layer 6. The contact 8 is connected to a metal layer 9, for example, a first metal interconnect layer. This (floating) metal layer 9 acts as an antenna during plasma etching, for example, reactive ion etching, of the same. In fact, charges of the plasma etchant are collected by the metal layer 9 and, thus, by the gate electrode layer 6 electrically connected to the metal layer 9 via contact 8.

In order to reduce antenna effects so-called antenna rules are provided. The antenna rules may give an allowable ratio of metal area to gate area for each interconnect layer. In practical applications, violations of the rules cannot be avoided and, thus, means for fixing or accounting for such violations on the actual design have to be provided. Those means typically include the provision of protection diodes. A protection diode may be formed with an $n^+$ implant in a p-substrate or a $p^+$ implant in an n-well away from the source/drain regions of a MOSFET. By connecting the diode to a metal element near the gate the diode can protect the gate dielectric against charging damages.

However, antenna rules introduced for bulk technologies are conventionally not used for silicon-on-insulator (SOI) technologies. In particular, no substrate diode protection can be provided in the context of the SOI technologies. For example, a fully depleted SOI (FDSOI) cell design with wells formed below p-channel FETs and n-channel FETs does not allow for the provision of substrate diodes for fixing antenna effects.

The present disclosure provides means for reducing antenna effects in the context of SOI, in particular, FDSOI, technologies which may help to substantially overcome or at least reduce some or all of the above-mentioned issues.

SUMMARY OF THE INVENTION

The following presents a simplified summary of the disclosure in order to provide a basic understanding of some aspects of the disclosure. This summary is not an exhaustive overview of the disclosure. It is not intended to identify key or critical elements of the disclosure or to delineate the scope of the disclosure. Its sole purpose is to present some concepts in a simplified form as a prelude to the more detailed description that is discussed later.

Generally the subject matter disclosed herein relates to the formation of semiconductor devices comprising transistor devices, and more particularly silicon-on-insulator (SOI) or fully depleted silicon-on-insulator (FDSOI) MOSFETs wherein the antenna effect is reduced as compared to the art.

In one illustrative embodiment, a semiconductor device is disclosed that comprises a) a power line, an SOI substrate comprising a semiconductor layer and a semiconductor bulk substrate comprising a first doped region and b) a first transistor device formed in and above the SOI substrate and comprising a first gate dielectric formed over the semiconductor layer and a first gate electrode formed over the gate dielectric. Furthermore, the semiconductor device comprises c) a first diode that is electrically connected to the first gate electrode and d) a second diode that is electrically connected to the first diode and the power line. The first and second diodes are partially formed in the first doped region, i.e., the first and second diodes share the first doped region. In one embodiment, the diodes can operate as protection diodes protecting the gate dielectric against plasma charging damages by charges collected by the gate electrode during plasma involved processing (reduction of antenna effect).

Another illustrative semiconductor device disclosed herein comprises a power line, a p-channel transistor device comprising a channel region formed in a semiconductor layer of an SOI substrate, a first p-well formed in a semiconductor bulk substrate of the SOI substrate, a second p-well formed in the semiconductor bulk substrate and separated from the first p-well by a first n-well formed below the p-channel transistor device. By the terms p-well and n-well p-doped and n-doped regions in the semiconductor bulk substrate are denoted. Moreover, in this example, the semiconductor device comprises a first diode electrically connected to a gate electrode of the p-channel transistor device and partially formed in the second p-well as well as a second diode electrically connected to the first diode and the power line and partially formed in the second p-well.

Also disclosed herein are various methods for reducing the antenna effect in a semiconductor device comprising a transistor device formed in and above an SOI substrate. In one illustrative example, the method comprises forming a first diode partially in a first doped region of a semiconductor bulk substrate of the SOI substrate and partially in a second doped region of a semiconductor layer of the SOI substrate and forming a second diode partially in the first doped region of the semiconductor bulk substrate of the SOI substrate and partially in a third doped region of the semiconductor layer of the SOI substrate. The method, furthermore, comprises electrically connecting the first diode to a gate electrode of the transistor device and electrically connecting the second diode to a power line. The second and third doped regions may be formed on a buried oxide layer that is formed between the semiconductor bulk substrate and the semiconductor layer.

Additional embodiments, features and advantages of the present disclosure will be described with reference to the drawings. In the description, reference is made to the accompanying figures that are meant to illustrate embodiments of the disclosure. It is understood that such embodiments do not represent the full scope of the disclosure.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

While the present disclosure is described with reference to the examples as illustrated in the following detailed description as well as in the drawings, it should be understood that the following detailed description as well as the drawings are not intended to limit the subject matter to the particular illustrative embodiments disclosed, but rather the described illustrative embodiments merely exemplify the various aspects, the scope of which is defined by the appended claims.

Various illustrative embodiments of the disclosure are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The following embodiments are described in sufficient detail to enable those skilled in the art to make use of the disclosure. It is to be understood that other embodiments would be evident, based on the present disclosure, and that system, structure, process or mechanical changes may be made without departing from the scope of the present disclosure. In the following description, numeral-specific details are given to provide a thorough understanding of the disclosure. However, it would be apparent that the embodiments of the disclosure may be practiced without the specific details. In order to avoid obscuring the present disclosure, some well-known circuits, system configurations, structure configurations and process steps are not disclosed in detail.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

Generally, manufacturing techniques and semiconductor devices in which n-channel transistors and/or p-channel transistors may be formed are described herein. In particular, the transistors may comprise fully depleted SOI triple-well structures. The manufacturing techniques may be integrated in CMOS manufacturing processes. As will be readily apparent to those skilled in the art upon a complete reading of the present application, the present method is applicable to a variety of technologies, for example, NMOS, PMOS, CMOS, etc., and is readily applicable to a variety of devices, including, but not limited to, logic devices, memory devices, SRAM devices etc., in principle. The techniques and technologies described herein can be utilized to fabricate MOS integrated circuit devices, including nMOS integrated circuit devices, pMOS integrated circuit devices, and cMOS integrated circuit devices. In particular, the process steps described herein are utilized in conjunction with any semiconductor device fabrication process that forms gate structures for integrated circuits, including both planar and non-planar integrated circuits. Although the term "MOS" properly refers to a device having a metal gate electrode and an oxide gate insulator, that term is used throughout to refer to any semiconductor device that includes a conductive gate electrode (whether metal or other conductive material) that is positioned over a gate insulator (whether oxide or other insulator) which, in turn, is positioned over a semiconductor substrate.

The present disclosure, generally, provides means for alleviating problems caused by the antenna effect. In particular, configurations are disclosed that comprise diodes formed in order to protect the gate dielectrics of FETs from charging damages during plasma processing.

Figure 2:
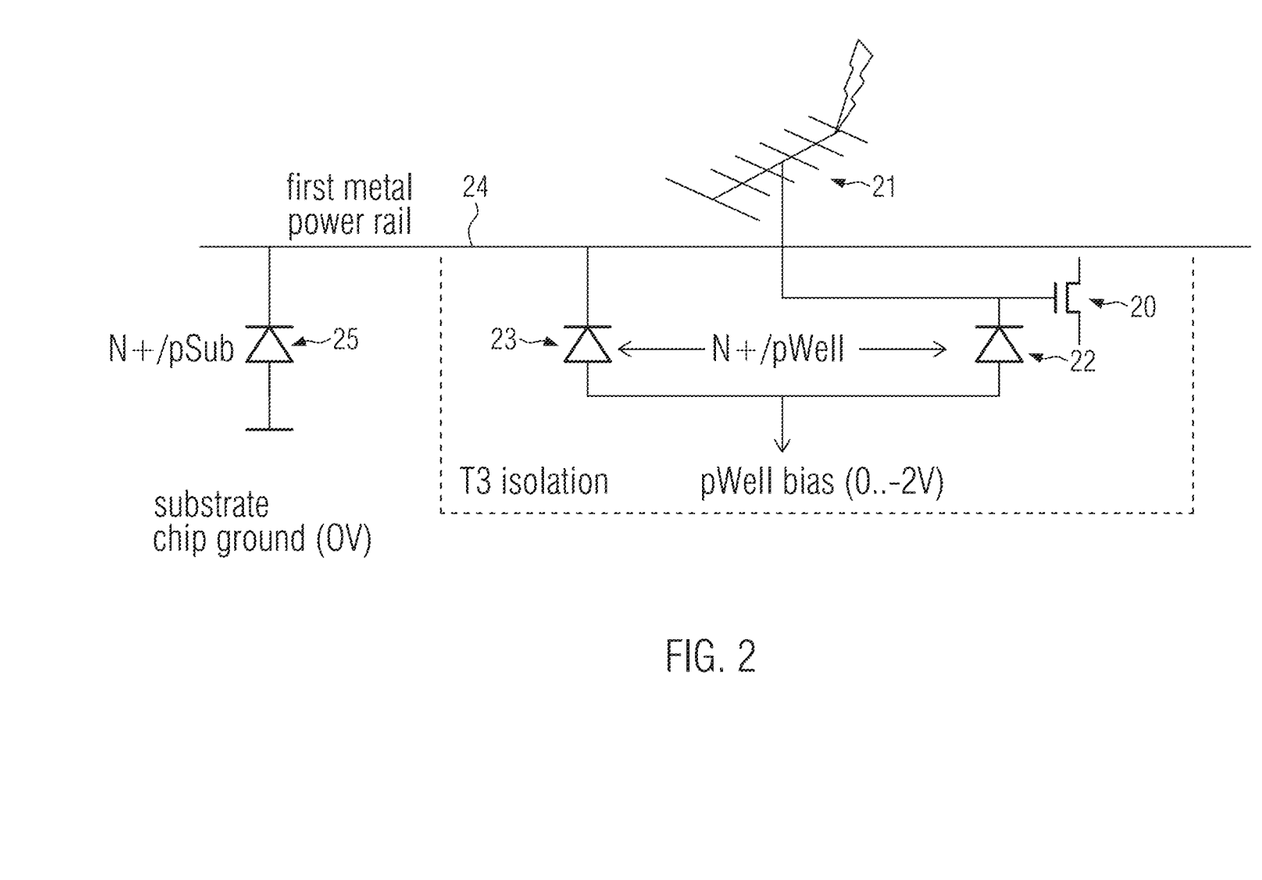
FIG. 2 illustrates a configuration including local diodes and a substrate diode in order to reduce the antenna effect in the context of manufacturing a semiconductor device comprising a p-channel FET.

FIG. 2 schematically illustrates an exemplary configuration for reducing the antenna effect in accordance with the present disclosure. The configuration shown in FIG. 2 comprises a p-channel FET 20 formed over a triple well structure. The FET 20 may be an FDSOI FET (Fully Depleted Silicon-on-Insulator Field Effect Transistor) formed in and over an SOI substrate. The SOI substrate may comprise a semiconductor substrate, a buried insulating layer formed on the semiconductor substrate and a semiconductor layer formed on the buried insulating layer. The gate of the FET 20 is connected to an antenna 21, for example, in form of a metal layer separated from the FET 20 by an interlayer dielectric. In particular, a p-well may be formed below the FET and there are provided a first diode 22 and a second diode 23 sharing the p-well. The antenna is connected to an $n^+$ region of the first diode 22 embedded in the p-well. The second diode 23 is connected to a power rail (line) 24 ($V_{ss}$ line), for example, a power rail of a first metal interconnect layer, at the bottom of a standard cell comprising the FET 20.

Outside the p-well area a third diode 25 is formed in order to tie down the semiconductor substrate wherein the p-well is formed to the power rail 24. Particularly, the third diode 25 may be formed at the end of a standard cell row, i.e., in a suitably provided edge cell not including active devices.

It is noted that the p-well that is formed below the p-channel FET 20 may extend to a wafer area where n-channel FETs are formed, for example, a lower half of a standard cell area. Thereby, the p-channel FETs can be formed in a continuous stripe of an active semiconductor layer, whereas the stripe of the active layer of the n-channel FETs has to be cut.

Figure 3A:
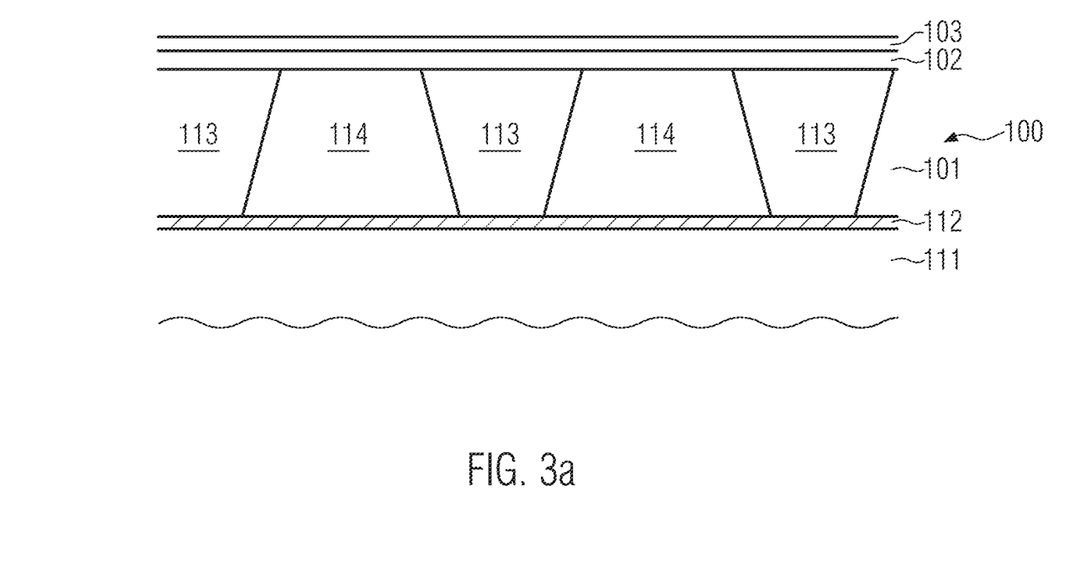
FIGS. 3a and 3b illustrate a process of manufacturing a semiconductor device comprising FETs and protection diodes according to an example of the present disclosure.
Figure 3B:
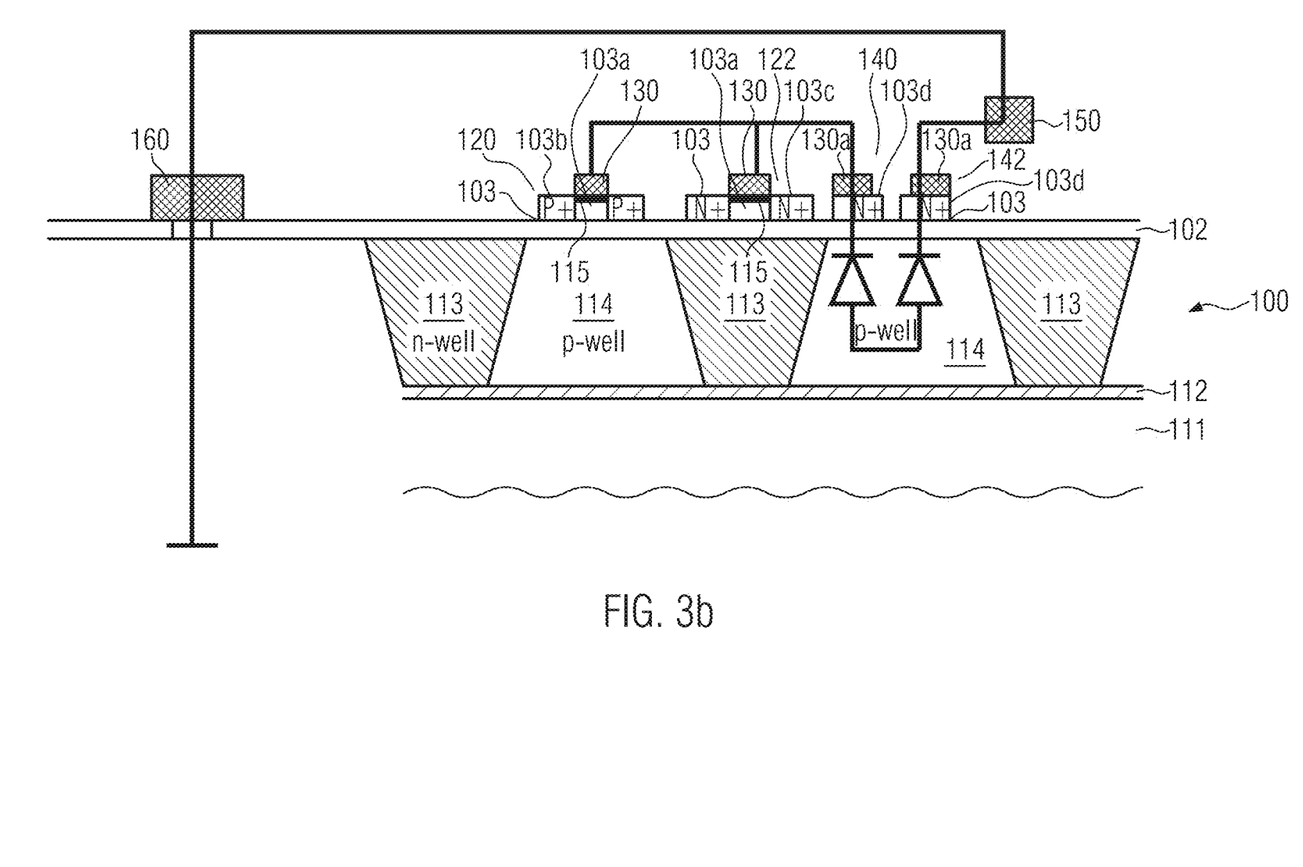

An exemplary semiconductor device and the manufacturing of the same are illustrated in FIGS. 3*a* and 3*b*. As shown in FIG. 3*a* an SOI substrate 100 is provided. It is noted that FIG. 3*a* only shows a small portion of the entire SOI substrate 100 or wafer. The SOI substrate 100 may comprise a bulk semiconductor substrate 101 wherein insulation regions (not shown), for example, shallow trench insulations, may be formed to isolate active devices from each other. The bulk semiconductor substrate 101 can be a silicon substrate, in particular, a single crystal silicon substrate. Other materials can be used to form the semiconductor substrate as, for example, germanium, silicon germanium, gallium phosphate, gallium arsenide, etc.

An insulation/buried oxide layer 102 may be formed on the bulk semiconductor substrate 101. The buried oxide layer 102 may include a dielectric aterial, such as silicon dioxide, and may be an ultra-thin buried oxide (UT-BOX) having a thickness in a range from about 10 to 20 nm.

A semiconductor layer 103 is formed on the buried oxide layer 102. The semiconductor layer 103 provides the channel region of the transistor devices to be formed over and in the SOI substrate 100 and may be comprised of any appropriate semiconductor material, such as silicon, silicon/germanium, silicon/carbon, other II-VI or III-V semiconductor compounds and the like. The semiconductor layer 103 may have a thickness suitable for forming a fully depleted field effect transistor, for example, a thickness in a range from about 5 to 8 nm. The semiconductor layer 103 may be doped by p-type dopants in regions where n-channel transistors will be formed and may be doped by n-type dopants in regions where p-channel transistors will be formed. The semiconductor bulk substrate 101, the buried oxide layer 102 and the semiconductor layer 103 may constitute an FDSOI substrate.

A lower part 111 of the semiconductor bulk substrate 101 may be doped with a p-type dopant. The lower part is isolated from well regions formed at an upper part by a deep n-well 112. N-wells 113 and p-wells 114 are formed over the deep n-well 112. In fact, a plurality of wells comprising source/drain wells and contact wells may be formed. The SOI substrate 100 of FIG. 3a may be formed as follows. The semiconductor bulk substrate 101 may be manufactured with a p-type dopant material, such as boron or boron di-fluoride, at a concentration level of approximately $10^{12}$-$10^{16}$ ions/cm$^3$, for example. A first implantation mask layer may be formed over the SOI substrate 100 and ion implantation may be performed using the first implantation mask layer to form the deep n-well 112. The ion implant process may be performed using an n-type dopant material, such as arsenic, phosphorous, etc., at a dopant dose of approximately $10^{10}$-$10^{14}$ ions/cm$^2$, for example. The resulting deep n-well 112 may have a dopant concentration level that ranges from approximately $10^{16}$-$10^{19}$ ions/cm$^3$, for example. The implant energy used during the ion implant process will vary depending upon the species of dopant atoms implanted. If, for example, phosphorous is used as the dopant material, the implant energy may vary from approximately 20-100 keV.

After formation of the deep n-well 112 the first implantation mask layer is removed and a second implantation mask layer is formed over the SOI substrate 100 in order to form the n-wells 113. N-type dopant material, such as arsenic, phosphorous, etc. may be used. The n-wells 113 may have dopant concentrations of approximately $10^{17}$-$10^{20}$ ions % cm$^3$, for example. The ion implant process may be performed with an N-type dopant material, e.g., arsenic, phosphorous, etc., at a dopant dose of approximately $10^{11}$-$10^{15}$ ions/cm$^2$, for example. The implant energy used during the implant process will vary depending upon the species of the dopant atoms implanted. If, for example, arsenic is the dopant material, the implant energy may vary from approximately 10-35 keV.

After formation of the n-wells 113 the second implantation mask layer is removed and a third implantation mask layer is formed over the SOI substrate 100 in order to form the p-wells 114. It goes without saying the order of the formation of the n-wells 113 and p-wells 114 can be reversed. P-type dopant material, such as boron, boron di-fluoride, etc. may be used. The p-wells may have dopant concentrations of approximately $10^{17}$-$10^{20}$ ions/cm$^3$, for example. The ion implant process may be performed with a p-type dopant material, e.g., boron, boron di-fluoride, etc., at a dopant dose of approximately $10^{11}$-$10^{15}$ ions/cm$^2$, for example. The implant energy used during the implant process will vary depending upon the species of the dopant atoms implanted. If boron is the dopant material, the implant energy may vary from approximately 5-30 keV.

It is noted that individual contact wells and/or source/drain wells (not shown) may be formed in the n-wells 113 and p-wells 114, respectively. For example, source/drain wells may be formed by various counter doping methods with a concentration of approximately $10^{14}$-$10^{17}$ ions/cm$^3$ of a p-type dopant (n-type dopant) material for an NMOS (PMOS) device. Contact wells may be doped with a p-type dopant material at a relatively high concentration, $10^{20}$ or more ions/cm$^3$. Furthermore, it is noted that isolation regions (not shown) may be formed in the semiconductor layer 103 before or after the formation of the n-wells 113 and p-wells 114.

In the manufacturing step shown in FIG. 3b transistor devices 120 and 122 are formed. The transistor devices 120 and 122 comprise portions 103a of the patterned semiconductor layer 103 as channel regions. Moreover, the transistor device 120 comprises p-doped source/drain regions 103b formed in portions of the semiconductor layer 103 and the transistor device 122 comprises n-doped source/drain regions 103c formed in portions of the semiconductor layer 103. Both transistor devices 120 and 122 comprise gate electrodes 130 that may be separated from the channel regions 103a by gate dielectrics 115. The gate dielectrics 115 may comprise high-k dielectric layer with a dielectric constant k of above 4. The gate dielectrics 115 may comprise a transitional metal oxide, such as at least one of hafnium oxide, hafnium dioxide and hafnium silicon-oxynitride.

The gate electrode 130 may comprise metal gates. The material of the metal gates for n-channel transistor may include La, LaN or TiN and for p-channel transistors may include Al, MN or TiN. The metal gates may include a work function adjusting material, for example, TiN. In particular, the metal may comprise a work function adjusting material that comprises an appropriate transition metal nitride, for example, those from Groups 4-6 in the Periodic Table, including, for example, titanium nitride (TiN), tantalum nitride (TaN), titanium aluminum nitride (TiAiN), tantalum aluminum nitride (TaAlN), niobium nitride (NbN), vanadium nitride (VN), tungsten nitride (WN), and the like with a thickness of about 1 nm to about 60 nm. Moreover, the effective work function of the metal gate can be adjusted by added impurities, for example, Al, C or F. Moreover, the gate electrodes may comprise polysilicon gates at the top of the metal gates.

Furthermore, a first diode 140 and a second diode 142 are formed. The diodes 140 and 142 share the same p-well 114 and comprise n-doped portions 103d of the semiconductor layer 103. Gate electrode material 130a, for example, comprising portions of poly lines, is also formed on the n-doped portions 103d of the semiconductor layer 103. The pn-junctions of the diodes 140 and 142 are formed through openings formed in the insulation/buried oxide layer 102. The second diode 142 is electrically connected to a power rail 150, for example, a $V_{ss}$ line of a first metallization layer. The first diode 140 is electrically connected to the gate electrodes 130 of the transistor devices 120 and 122. Thereby, the diodes 140 and 142 can protect the gate dielectrics 115 below the gate electrodes 130 of the transistor devices 120 and 122 against plasma charging damages.

Outside the well areas 113 and 114 a third diode 160 is formed. The third diode 160 is electrically connected to the power rail 150 and to the semiconductor bulk substrate 101 (ground). Particularly, the third diode 160 may be formed at the end of a standard cell row, i.e., in a suitably provided edge cell not including active devices as the transistor devices 120 and 122.

As a result, the present disclosure provides means for the reduction of antenna effects based on local diodes formed in an SOI substrate, in particular, an FDSOI substrate, and electrically connected, on the one hand, to gate electrodes of transistor devices that are to be protected and, on the other hand, to a power rail of a metallization layer. The means may comprise two diodes sharing the same well region in a semiconductor bulk substrate of the (FD)SOI substrate and an additional third diode formed in an edge cell. The entire technique can be integrated in standard cells designs in the context of triple well layouts.

The particular examples disclosed above are illustrative only, as the disclosure may be modified and practiced in different but equivalent manners apparent to those skilled in the art having the benefit of the teachings herein. The exemplary methods and steps comprised therein can be combined in any appropriate manner.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A semiconductor device, comprising
   a power line;
   a Silicon-on-Insulator (SOI) substrate comprising a semiconductor layer and a semiconductor bulk substrate, said semiconductor bulk substrate comprising a first doped well region having a first conductivity type;
   a first transistor device formed in and above the SOI substrate, the first transistor device comprising a first gate dielectric formed over the semiconductor layer and a first gate electrode formed over the first gate dielectric;
   a first diode electrically connected to the first gate electrode; and
   a second diode electrically connected to the first diode and the power line, wherein both of the first and second diodes are partially formed in the same first doped well region having said first conductivity type.

2. The semiconductor device according to claim 1, wherein the semiconductor layer comprises a second doped region formed above the first doped well region and a third doped region formed above the same first doped well region, the first and second doped regions having a second conductivity type that is opposite of said first conductivity type, wherein the first diode is partially formed in the second doped region and the second diode is partially formed in the third doped region.

3. The semiconductor device according to claim 1, wherein the SOI substrate comprises a buried insulating layer formed between the semiconductor bulk substrate and the semiconductor layer and wherein the first diode comprises a first pn-junction positioned under a first opening in the buried insulating layer and the second diode comprises a second pn-junction positioned under a second opening in the buried insulating layer.

4. The semiconductor device according to claim 1, wherein the semiconductor bulk substrate comprises a fourth doped well region separated from the first doped well region by a fifth doped well region, the fourth doped well region having said first conductivity type and the fifth doped well regions having a second conductivity type that is opposite of said first conductivity type, wherein the first transistor device is formed above the fourth doped well region having said first conductivity type.

5. The semiconductor device according to claim 1, wherein the semiconductor bulk substrate comprises a fourth doped well region separated from the first doped well region by a fifth doped well region, the fourth doped well region having said first conductivity type and the fifth doped well regions having a second conductivity type that is opposite of said first conductivity type, the semiconductor device further comprising a second transistor device formed in and above the SOI substrate and above the fifth doped well region having said second conductivity type, the second transistor device comprising a second gate dielectric formed over the semiconductor layer and a second gate electrode formed over the second gate dielectric, wherein the first diode is electrically connected to the second gate electrode.

6. The semiconductor device according to claim 1, further comprising a third diode electrically connected to the power line and the semiconductor bulk substrate, wherein the third diode is formed outside the first doped well region.

7. The semiconductor device according to claim 1, wherein the SOI substrate is a Fully Depleted SOI substrate (FDSOI) and the first transistor device is an FDSOI field effect transistor.

8. The semiconductor device according to claim 1, further comprising a first deep doped region formed in the semiconductor bulk substrate below the first doped well region, wherein the first deep doped region separates the first doped well region from a second deep doped region.

9. A semiconductor device, comprising
   a power line;
   a p-channel transistor device comprising a channel region formed in a semiconductor layer of an SOI substrate;
   a first p-well formed in a semiconductor bulk substrate of the SOI substrate;
   a second p-well formed in the semiconductor bulk substrate and separated from the first p-well by a first n-well formed below the p-channel transistor device;
   a first diode electrically connected to a gate electrode of the p-channel transistor device and partially formed in the second p-well; and
   a second diode electrically connected to the first diode and the power line and partially formed in the second p-well.

10. The semiconductor device according to claim 9, further comprising an n-channel transistor device formed over the n-well and comprising a gate electrode electrically connected to the first diode.

11. The semiconductor device according to claim 9, wherein the first diode comprises a first n-doped region of the semiconductor layer and the second diode comprises a second n-doped region of the semiconductor layer.

12. The semiconductor device according to claim 9, further comprising a third diode electrically connected to the power line and the semiconductor bulk substrate and formed outside the first and second p-wells.

13. The semiconductor device according to claim 9, wherein the SOI substrate is a Fully Depleted SOI substrate (FDSOI) and the p-channel transistor device is an FDSOI field effect transistor.

14. The semiconductor device according to claim 9, wherein the SOI substrate comprises a buried insulating layer formed between the semiconductor bulk substrate and the semiconductor layer and wherein the first diode comprises a first pn-junction positioned under a first opening in the buried insulating layer and the second diode comprises a second pn-junction positioned under a second opening in the buried insulating layer.

15. The semiconductor device according to claim 9, further comprising a second n-well formed in the semiconductor bulk substrate below the first and second p-wells and the first n-well.

16. A method for reducing the antenna effect in a semiconductor device comprising a transistor device formed in and above an SOI substrate, the method comprising:
   forming a first diode partially in a first doped well region of a semiconductor bulk substrate of the SOI substrate and partially in a second doped region of a semiconductor layer of the SOI substrate, the first doped well region having a first conductivity type;
   forming a second diode partially in the first doped well region of the semiconductor bulk substrate of the SOI substrate and partially in a third doped region of the semiconductor layer of the SOI substrate, wherein both of the second and third doped regions are formed above the same first doped well region and wherein both of the second and third doped regions have a second conductivity type that is opposite of said first conductivity type;
   electrically connecting the first diode to a gate electrode of the transistor device; and
   electrically connecting the second diode to a power line.

17. The method according to claim 16, further comprising forming openings in a buried insulating layer arranged between the semiconductor bulk substrate and the semiconductor layer of the SOI substrate and filing the openings with a semiconductor material doped with dopants having said first conductivity type.

18. The method according to claim 16, further comprising forming a third diode outside the first doped region and electrically connecting the third diode to the power line and the semiconductor bulk substrate.

19. The method according to claim 16, wherein the transistor device is a triple-well FDSOI FET.

20. The method according to claim 16, wherein the transistor device is first transistor device, the method further comprising:
   forming a fourth doped well region in the semiconductor bulk substrate of the SOI substrate, the fourth doped well region having said first conductivity type, wherein the first transistor device is formed above the fourth doped well region;
   forming a fifth doped well region in the semiconductor bulk substrate of the SOI substrate, the fifth doped well region having said second conductivity type, wherein the fifth doped well region is formed between and separates the first doped well region and the fourth doped well region;
   forming a second transistor device above the fifth doped well region; and
   electrically connecting the first diode to a gate electrode of the second transistor device.

\* \* \* \* \*